(12) United States Patent
Chung et al.

(10) Patent No.: US 8,123,863 B2
(45) Date of Patent: Feb. 28, 2012

(54) EVAPORATION APPARATUS

(75) Inventors: Kyung-Hoon Chung, Suwon-si (KR); Seuk-Hwan Park, Suwon-si (KR); Yoon-Sang Kwon, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 780 days.

(21) Appl. No.: 12/230,803

(22) Filed: Sep. 4, 2008

(65) Prior Publication Data

US 2009/0081364 A1    Mar. 26, 2009

(30) Foreign Application Priority Data

Sep. 5, 2007 (KR) .......................... 10-2007-0089932

(51) Int. Cl.
*C23C 16/00* (2006.01)
(52) U.S. Cl. ........ 118/728; 118/729; 118/716; 118/727; 118/718
(58) Field of Classification Search .................. 118/728, 118/729, 716, 727, 718
See application file for complete search history.

(56) References Cited

U.S. PATENT DOCUMENTS

2002/0007740 A1* 1/2002 Cutcher ........................ 101/123
2005/0183670 A1* 8/2005 Grantham et al. ............ 118/726

FOREIGN PATENT DOCUMENTS

| JP | 2001-181821 | 7/2001 |
| JP | 2003-017255 | 1/2003 |
| JP | 2003-017258 | 1/2003 |
| JP | 2007-027082 | 2/2007 |
| KR | 10-2003-0095580 | 12/2003 |

OTHER PUBLICATIONS

English translation of KR 2003-0095580, Han et al. Dec. 2003.*
Japanese Office Action issued on Nov. 30, 2010 in the corresponding Japanese Patent Application No. 2007-277825 and Request for Entry of the Accompanying Document herewith.
Office action from Korean Patent Office issued in Applicant's corresponding Korean Patent Application No. 10-2007-0089932 dated Apr. 27, 2009 and Request for Entry of the Accompanying Office Action.

* cited by examiner

*Primary Examiner* — Keath Chen
(74) *Attorney, Agent, or Firm* — Robert E. Bushnell, Esq.

(57) ABSTRACT

An evaporation apparatus is capable of preventing a sag phenomenon in a substrate. The evaporation apparatus includes a substrate supporting unit. The substrate supporting unit includes a substrate supporter for supporting side walls of a substrate in a chamber toward the same direction as an intake direction of the substrate entering the chamber; and a substrate-aiding supporter for supporting other side walls of the substrate that are not supported by the substrate supporter.

15 Claims, 6 Drawing Sheets

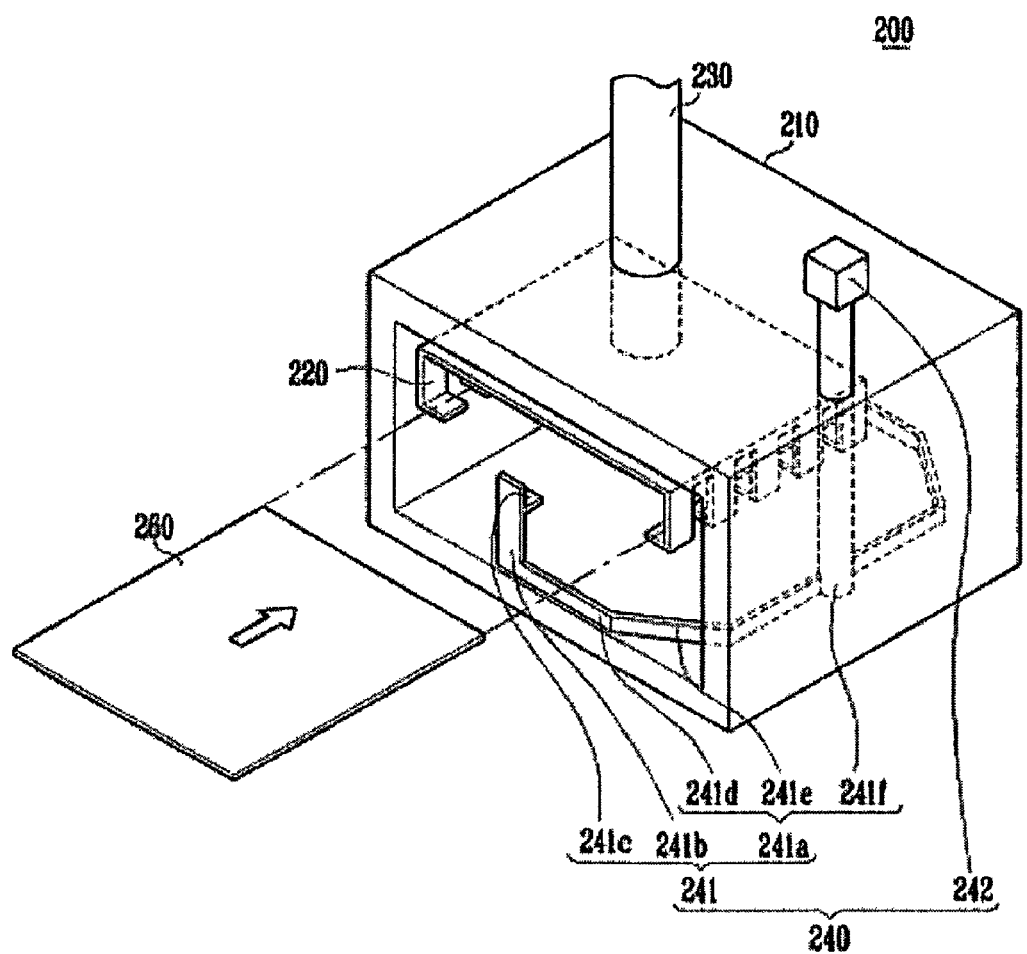

EVAPORATION APPARATUS

CLAIM OF PRIORITY

This application makes reference to, incorporates the same herein, and claims all benefits accruing under 35 U.S.C. §119 from an application for EVAPORATION APPARATUS earlier filed in the Korean Intellectual Property Office on 5 Sep. 2007 and there duly assigned Serial No. 10-2007-0089932.

BACKGROUND

1. Field of the Invention

The present invention relates to a process and an evaporation apparatus, and more particularly, to an evaporation apparatus capable of preventing a sag phenomenon of a substrate.

2. Discussion of Related Art

A contemporary evaporation apparatus may include a substrate supporting unit, and the substrate supporting apparatus includes a chamber and a substrate supporter for supporting two sides of a substrate in the chamber, when the substrate enters the chamber.

The substrate supporter may move repeatedly up and down driven by a lever assembly provided at the exterior of the chamber.

Referring to the method of supporting a substrate using the substrate supporter, the lever assembly is used to allow the substrate supporter to move down before the substrate enters the chamber. When the substrate enters the chamber, the substrate is loaded onto the substrate supporter. Then, the substrate supporter moves upwards.

More particularly, the substrate supporter supports the substrate by holding one side and another opposite side facing the one side of the substrate with the substrate supporter physically contacted with a bottom surface of the substrate, the bottom surface facing a lower surface of the chamber. In other words, two opposite sides of the substrate are supported by the substrate supporter with the substrate being loaded onto the substrate supporter.

When the substrate supporter supports two opposite sides of the substrate as described above, however, it is impossible to support a large-area substrate uniformly across the width of the substrate. That is to say, a central region of the substrate may sag due to the increased load of the substrate when the substrate is manufactured on a large scale. In other words, a large size substrate may become deformed due to the earth's gravity.

SUMMARY OF THE INVENTION

It is therefore one object of the present invention to provide a process and an improved evaporation apparatus to overcome the above stated disadvantageous sag phenomenon of the central region of the large-area substrate.

It is another object of the present invention to provide an evaporation apparatus capable of preventing a sag phenomenon of a substrate by providing a substrate-aiding supporter for supporting a substrate in the interior of the evaporation apparatus.

One embodiment of the present invention is achieved by providing an evaporation apparatus including a substrate supporting unit. Here, The substrate supporting unit includes a substrate supporter for supporting side walls of a substrate in a chamber toward the same direction as an intake direction of the substrate entering the chamber; and a substrate-aiding supporter for supporting the other side walls of the substrate that are not supported by the substrate supporter.

Here, the substrate-aiding supporter may include a supporting bar for supporting at least one side wall of the substrate; and a driver for moving the supporting bar up or down. The supporting bar may include a fixing plate having a supporting plate contacted with a bottom surface of the substrate; and a coupling bar for coupling the driver to the fixing plate. Here, the coupling bar may be a pair of structures extended from both side walls of the substrate. Also, the fixing plate may be coupled to the coupling bar and be presented in the plural number.

Also, the substrate-aiding supporter may include a first substrate-aiding supporter for supporting side walls of the substrate; and a second substrate-aiding supporter disposed to face the first substrate-aiding supporter and supporting the same side walls of the substrate.

BRIEF DESCRIPTION OF THE DRAWINGS

A more complete appreciation of the invention and many of the attendant advantages thereof, will be readily apparent as the same becomes better understood by reference to the following detailed description when considered in conjunction with the accompanying drawings in which like reference symbols indicate the same or similar components, wherein:

These and/or other embodiments and features of the invention will become apparent and more readily appreciated from the following description of certain exemplary embodiments, taken in conjunction with the accompanying drawings of which:

FIGS. 4A to 4C are perspective views showing a method for supporting a substrate according to the first exemplary embodiment of the present invention;

DETAILED DESCRIPTION OF PREFERRED EMBODIMENTS

Figure 1A:
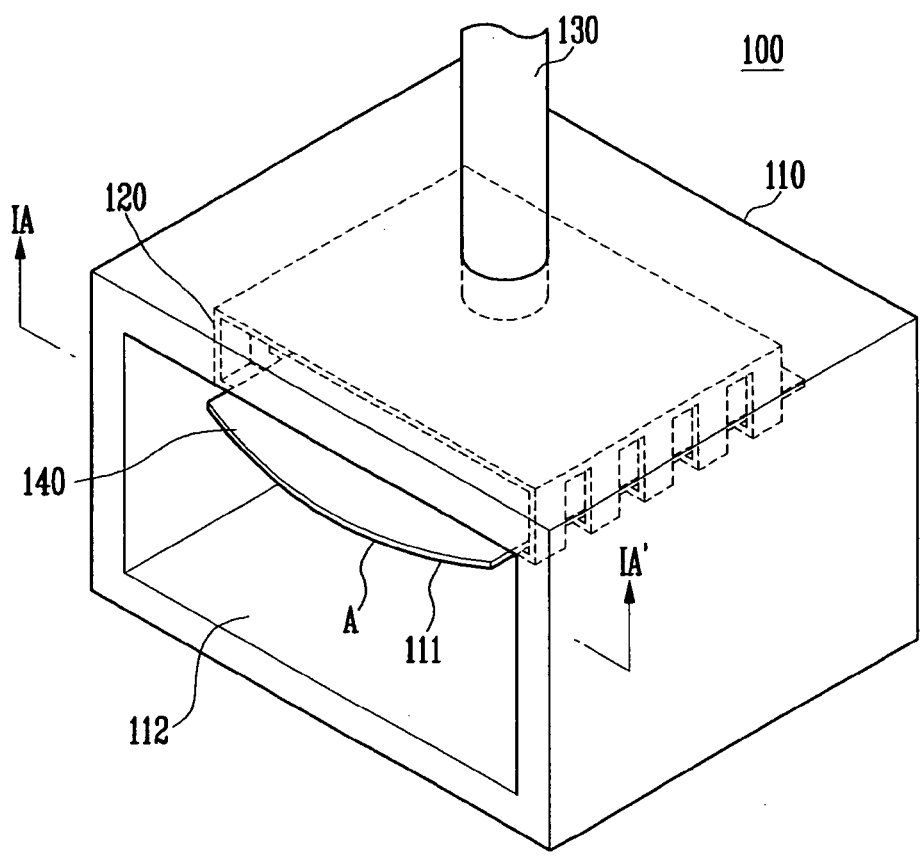
FIG. 1A is a perspective view showing a contemporary evaporation apparatus including a substrate supporting unit.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on the another element or be indirectly on the another element with one or more intervening elements interposed therebetween. Also, when an element is referred to as being "connected to" another element, it can be directly connected to the another element or be indirectly connected to the another element with one or more intervening elements interposed therebetween. Hereinafter, like reference numerals refer to like elements.

FIG. 1A is a perspective view showing a contemporary evaporation apparatus including a substrate supporting unit.

Referring to FIG. 1, a substrate supporting apparatus 100 includes a chamber 110 and a substrate supporter 120 for supporting two edges of substrate 140 in chamber 110, and substrate 140 enters chamber 110.

Substrate supporter 120 may move repeatedly up and down driven by a lever assembly 130 provided at the exterior of chamber 110.

Referring to the method of supporting a substrate 140 using substrate supporter 120, lever assembly 130 is used to allow substrate supporter 120 to move down before substrate 140 enters chamber 110. When substrate 140 enters chamber 110, substrate 140 is loaded by substrate supporter 120. Then, substrate supporter 120 moves upwards.

More particularly, substrate supporter 120 supports substrate 140 by holding one edge 161 and another opposite edge 163 facing the one side of substrate 140 with substrate supporter 120 physically contacted with bottom surface 111 of substrate 140, and bottom surface 111 of substrate 140 facing lower surface 112 of chamber 110. That is to say, two opposite sides of substrate 140 are supported by substrate supporter 120 with substrate 140 being loaded onto substrate supporter 120.

Figure 1B:
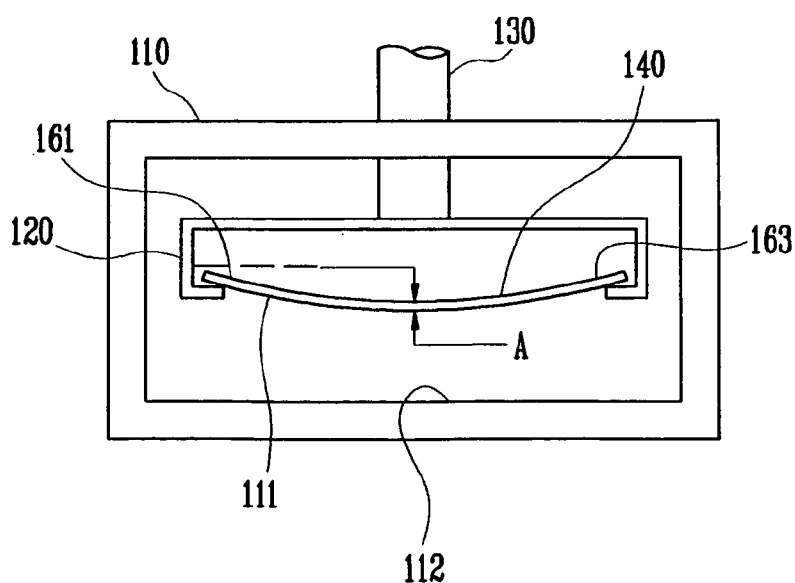
FIG. 1B is cross sectional view taken along line IA-IA' as shown in FIG. 1 showing a contemporary evaporation apparatus where a substrate sag due to an increased load of the substrate.

FIG. 1B is cross sectional view taken along line IA-IA' as shown in FIG. 1A showing a contemporary evaporation apparatus where a substrate sags due to an increased load of the substrate. When the substrate supporter supports merely two edges 161, 163 of substrate 140 as described above, however, it is impossible to support a large-area substrate uniformly. In other words, a central region of substrate 140 may sag as shown by "A" due to the increased load of substrate 140 when substrate 140 is manufactured at a large scale. In other words, a large size substrate may be deformed due to the earth's gravity. Here, the evaporation apparatus is negerally made of stainless steel. The thickness of substrate 140 is normally 0.5 mm and the size of the substrate is approximately 730 mm by 460 mm. The measurements of the sag phenomenon occurring to the substrate are standardized about 7 mm.

Figure 2:
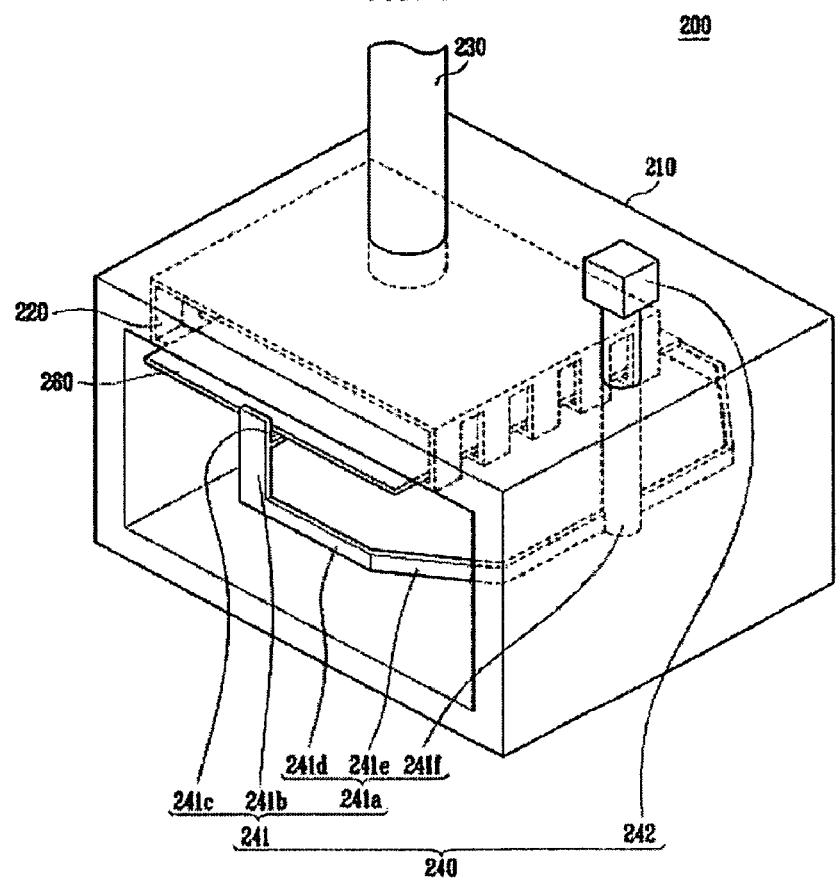
FIG. 2 is a perspective view showing an evaporation apparatus including a substrate supporting unit constructed as a first exemplary embodiment of the present invention.
Figure 3:
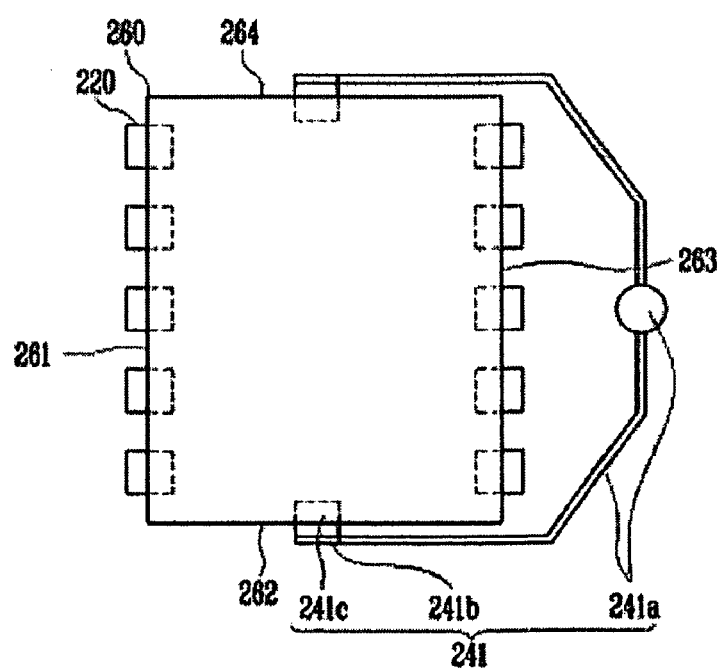
FIG. 3 is a bottom view showing arrangement of a substrate supporter and a substrate-aiding supporter constructed as the first exemplary embodiment of the present invention.

FIG. 2 is a perspective view showing an evaporation apparatus including a substrate supporting unit constructed as a first exemplary embodiment of the present invention, and FIG. 3 is a bottom view showing arrangement of a substrate supporter and a substrate-aiding supporter constructed as the first exemplary embodiment of the present invention.

Referring to FIGS. 2 and 3, evaporation apparatus 200 according to one exemplary embodiment of the present invention includes a substrate supporting unit. Here, the substrate supporting unit includes a substrate supporter 220 for supporting side walls of a substrate in a chamber 210, with the supported side walls of substrate 260 being along with the same direction as an intake direction of substrate 260 entering chamber 210; and a substrate-aiding supporter 240 for supporting other side walls of substrate 260 that are not supported by substrate supporter 220.

Substrate supporter 220 may repeatedly move up and down by means of lever assembly 230 provided at the exterior of chamber 210. Substrate supporter 220 may support substrate 260 entering chamber 210 through the up/down movements.

As shown in FIG. 3, substrate 260 has a four sides, one side of substrate 260 that is in parallel to a direction where substrate 260 enters chamber 210 is defined as a first side 261, and sides of substrate 260 other than first side 261 may be sequentially defined as a second side 262, a third side 263 and a fourth side 264 for convenience. For example, one side that is in parallel with a direction where substrate 260 enters chamber 200 is referred to as a first side 261, one side opposite to and facing first side 261 is referred to as a third side 263, one side that is vertical to a direction where substrate 260 enters chamber 210 is referred to as a second side 262, and one side opposite to and facing second side 262 is referred to as a fourth side 264.

In order to support substrate 260 using substrate supporter 220, lever assembly 230 is used to move substrate supporter 220 downward to chamber 210. When substrate 260 enters chamber 210, substrate supporter 220 moves up, and a bottom surface of substrate 260 is loaded on substrate supporter 220. Here, substrate supporter 220 supports first side 261 and third side 263 of substrate 260.

Meanwhile, a substrate-aiding supporter 240 for aiding to support substrate 260 is provided in at least one side of substrate supporter 220.

Substrate-aiding supporter 240 is a means for supporting other side walls of substrate 260 that are not supported by substrate supporter 220, and substrate-aiding supporter 240 supports second side and fourth side 262,264 of substrate 260 in this exemplary embodiment.

Substrate-aiding supporter 240 includes a supporting bar 241 for supporting second side and fourth side 262, 264 of substrate 260, and a driver 242 for moving supporting bar 241 up or down. Also, supporting bar 241 includes a supporting plate 241c for supporting a bottom surface of the second side and fourth side 262,264 of substrate 260, a fixing plate 241b formed vertically to supporting plate 241c in order to prevent the movement of substrate 260 loaded on supporting plate 241c, and a coupling bar 241a for coupling driver 242 to fixing plate 241b.

Supporting plate 241c may be formed in various shapes, and may be formed in a plate shape so as to support the bottom surface of substrate 260 more stably. In other words, if supporting plate 241c is formed in a plate shape, substrate 260 may be horizontally installed on supporting plate 241c.

Fixing plate 241b is formed vertically to supporting plate 241c, and fixing plate 241b may prevent the movement of substrate 260 loaded on supporting plate 241c since fixing plate 241b is protruded toward an upper direction of supporting plate 241c.

A driver 242 for driving substrate-aiding supporter 240 is formed at the exterior of chamber 210. Driver 242 is mechanically coupled to supporting bar 241 and moves supporting bar 241 in an up or down direction.

Also, a coupling bar 241a is formed between driver 242 and fixing plate 241b and couples fixing plate 241b to driver 242. Coupling bar 241a is composed of a cylinder member 241f coupled to driver 242, first stick member 241d formed vertically to fixing plate 241b, and a second stick member 241e for coupling first stick member 241d to cylinder member 241f. Also, coupling bar 241a and fixing plate 241b are preferably formed spaced apart from a circumference of substrate 260 and substrate supporter 220 so as to prevent themselves from being in contact with a substrate 260 and a mask (not shown) provided on the upper surface of substrate 260.

As described above, supporting bar 241 and driver 242 are physically coupled to each other and may be formed integrally, and therefore driver 242 may be used to drive supporting plate 241c and fixing plate 241b moving up or down.

Also, supporting bar 241 including supporting plate 241c, fixing plate 241b and coupling bar 241a may uniformly support the second side and fourth side 262,264 of substrate 260 since they are formed with the same structure where they are disposed between second side and fourth side 262,264 of substrate 260.

As described above, for this exemplary embodiment, second side and fourth side 262,264 of substrate 260 that are not supported by substrate supporter 220 are supported using substrate-aiding supporter 240, and therefore four sides of substrate 260 may be supported uniformly.

Therefore, it is possible to prevent substrate 260 from being sagged downward to chamber 210, and load large-area substrate 260 onto the substrate supporting unit. Also, as the sag phenomenon of substrate 260 is prevented, it is possible to reduce the process time for aligning a mask coupled to substrate 260.

Figure 4B:
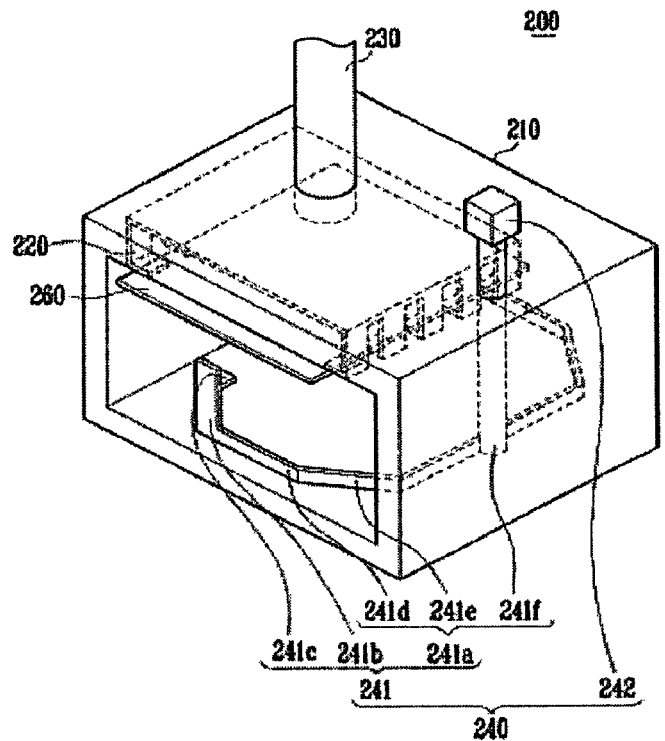
Figure 4C:
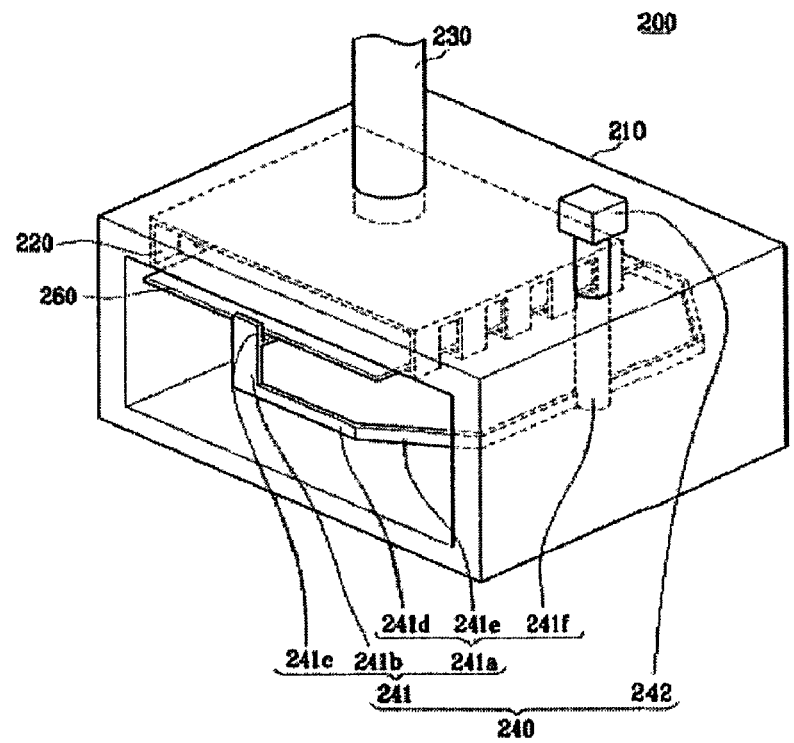

FIGS. 4A through 4C are perspective views showing a method for supporting a substrate according to the first exemplary embodiment of the present invention.

Referring to FIG. 4A, substrate supporter 220 and substrate-aiding supporter 240 provided in an upper portion of the interior of chamber 210 move downward to chamber 210. Here, substrate-aiding supporter 240 is disposed at a position having a shorter distance from lower surface of chamber 210 than from substrate supporter 220. Therefore, an opening for receiving substrate 260 is opened to allow substrate 260 to enter chamber 210.

Referring to FIG. 4B, when substrate 260 enters chamber 210, substrate 260 is disposed between substrate supporters 220. Then, lever assembly 230 is used to move substrate supporter 220 and load substrate 260 onto substrate supporter 220. Here, substrate supporter 220 supports first side and third side 261, 263 of substrate 260.

Referring to FIG. 4C, driver 242 is used to move substrate-aiding supporter 240 so as to support second side and fourth side 262, 264 of substrate 260. Therefore, second and fourth sides 262, 264 of substrate 260 are loaded by substrate-aiding supporter 240.

As described above, evaporation apparatus 200 is provided with substrate supporter 220 and substrate-aiding supporter 240 to support four sides of substrate 260, thereby preventing a sag phenomenon of substrate 260.

Figure 5:
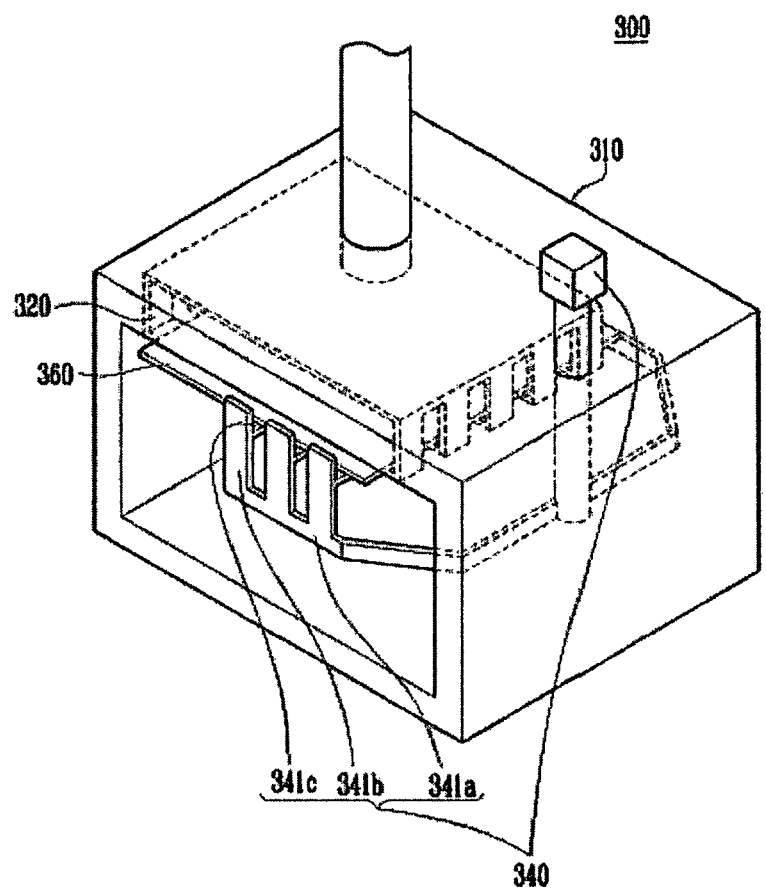
FIG. 5 is a perspective view showing an evaporation apparatus including a substrate supporting unit constructed as a second exemplary embodiment of the present invention.
Figure 6:
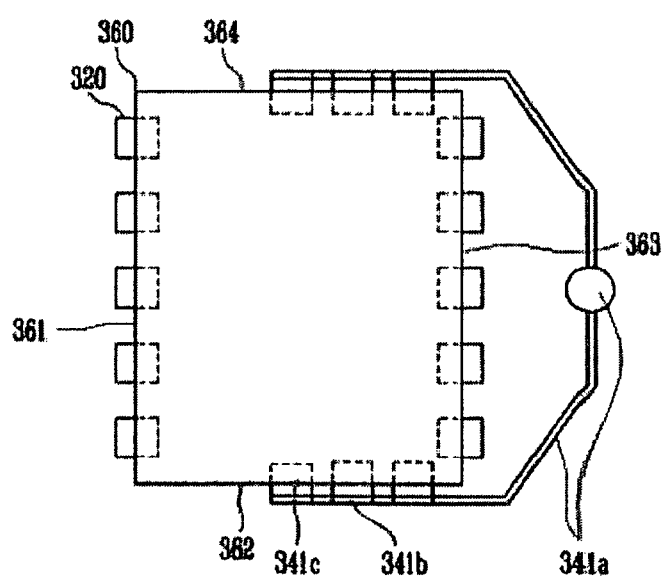
FIG. 6 is a bottom view showing arrangement of a substrate supporter and a substrate-aiding supporter constructed as the second exemplary embodiment of the present invention.

FIG. 5 is a perspective view showing an evaporation apparatus including a substrate supporting unit constructed as the second exemplary embodiment of the present invention and FIG. 6 is a bottom view showing arrangement of a substrate supporter and a substrate-aiding supporter constructed as the second exemplary embodiment of the present invention.

Referring to FIGS. 5 and 6, evaporation apparatus 300 constructed as the present invention includes a substrate supporting unit. The substrate supporting unit includes a substrate supporter 320 for supporting side walls of a substrate 360 in a chamber 310 with the side walls 361, 363 of substrate 360 being along the direction as an intake direction of substrate 360 entering chamber 310; and a substrate-aiding supporter 340 for supporting the other side walls of substrate 360 that are not supported by substrate supporter 320.

The second exemplary embodiment of the present invention is almost identical to the first exemplary embodiment of the present invention expect that the second exemplary embodiment employs more than one supporting plate along with more than one fixing plate. Here, fixing plate 341b, provided with supporting plate 341c that is in contact with the bottom surface of substrate 360, is present in the plural number, and therefore the second side and fourth side 362, 364 of substrate 360 may be supported uniformly. Reference number 341a refers to a coupling bar.

Figure 7:
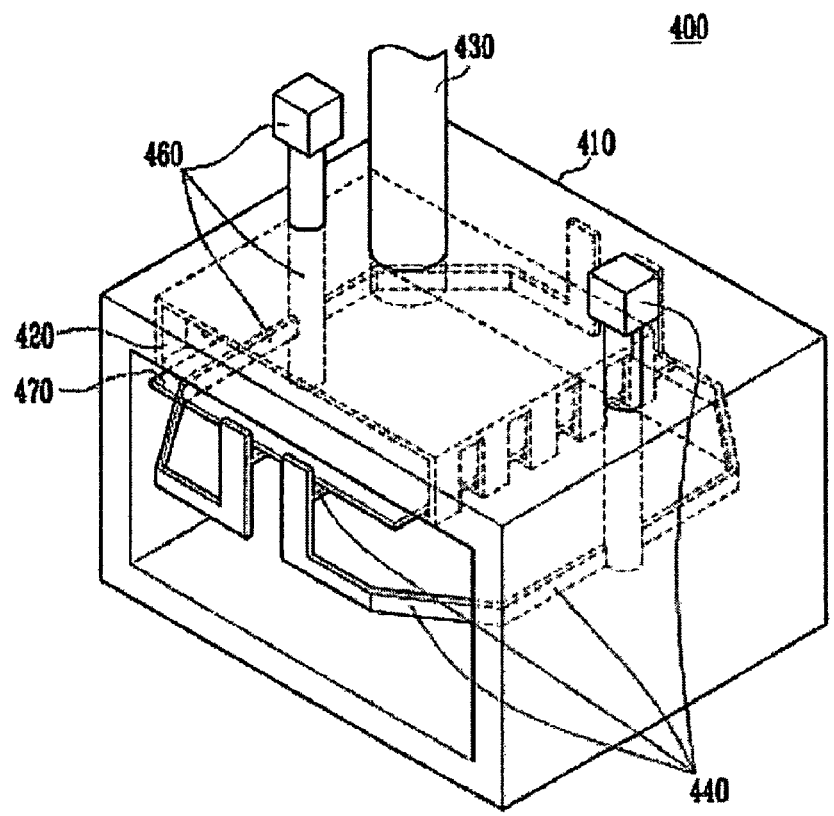
FIG. 7 is a perspective view showing an evaporation apparatus including a substrate supporting unit constructed as a third exemplary embodiment of the present invention.
Figure 8:
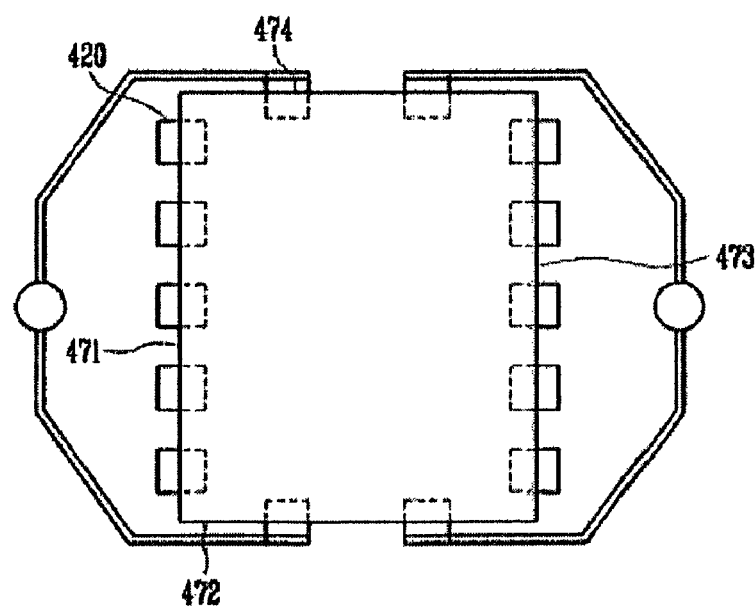
FIG. 8 is a bottom view showing arrangement of a substrate supporter and a substrate-aiding supporter constructed as the third exemplary embodiment of the present invention.

FIG. 7 is a perspective view showing an evaporation apparatus including a substrate supporting unit according to the third exemplary embodiment of the present invention, and FIG. 8 is a bottom view showing arrangement of a substrate supporter and a substrate-aiding supporter according to the third exemplary embodiment of the present invention.

Referring to FIGS. 7 and 8, evaporation apparatus 400 constructed as the present invention includes a substrate supporting unit. The substrate supporting unit includes a substrate supporter 420 for supporting side walls of a substrate 470 in a chamber 410 toward the same direction as an intake direction of substrate 470 entering chamber 410; and substrate-aiding supporters 440, 460 for supporting the other side walls of substrate 460 that are not supported by substrate supporter 420.

The second exemplary embodiment of the present invention is almost identical to the first exemplary embodiment of the present invention, except that the substrate-aiding supporters are installed as a first substrate-aiding supporter 440 and a second substrate-aiding supporter 460.

First substrate-aiding supporter 440 is disposed on a right surface of substrate supporter 420 to support a right region of second side and fourth side 472, 474 of substrate 470. Second substrate-aiding supporter 460 is formed on a left surface of substrate supporter 420 to support a left region of second side and fourth side 472, 474 of substrate 470.

Therefore, second side and fourth side 472, 474 of substrate 470 may be supported more stably by the substrate-aiding supporters.

According to the present invention, the substrate-aiding supporters for supporting a substrate may be further formed inside the evaporation apparatus to support all of four sides of the substrate. Therefore, the evaporation apparatus according to the present invention may be useful to prevent a sag phenomenon of the substrate and support the entire substrate uniformly.

Also, the evaporation apparatus constructed as the present invention may be useful to reduce a process time for aligning a mask coupled to the front of the substrate by preventing a sag phenomenon of the substrate, and also improve productivity when thin films are formed on the substrate.

It is evident to those skilled in the art that the evaporation apparatus constructed as the present invention may be applied to an organic light emitting display device (OLED), a liquid crystal display (LCD), a field emission display (FED), a plasma display panel (PDP), an electro luminescent display (ELD), and a vacuum fluorescent display (VFD).

Although exemplary embodiments of the present invention have been shown and described, it would be appreciated by those skilled in the art that changes might be made in these embodiments without departing from the principles and spirit of the invention, the scope of which is defined in the claims and their equivalents.

What is claimed is:

1. An evaporation apparatus, comprising:
   a substrate supporting unit comprising:
      a substrate supporter supporting a first group of side walls of a substrate disposed within a chamber, with the first group of side walls disposed along a same direction as an intake direction of the substrate entering the chamber; and
      a substrate-aiding supporter supporting a second group of side walls of the substrate that are different from the first group of side walls.

2. The evaporation apparatus of claim 1, in which the substrate-aiding supporter comprises:
- a supporting bar for supporting at least one of the second group of side walls of the substrate; and
- a driver for driving the supporting bar in opposite directions.

3. The evaporation apparatus of claim 2, in which the supporting bar comprises:
- a fixing plate having a supporting plate in physical contact with a bottom surface of the substrate; and
- a coupling bar for physically coupling the driver to the fixing plate.

4. The evaporation apparatus of claim 3, in which the coupling bar comprises a pair of structures extended from the second group of side walls of the substrate that are different from the first group of side walls, with the pair of structures physically coupled to the driver.

5. The evaporation apparatus of claim 4, in which the substrate-aiding supporter comprises:
- a first substrate-aiding supporter for supporting the second group of side walls of the substrate that are different from the first group of side walls being supported by the substrate supporter; and
- a second substrate-aiding supporter disposed to face the first substrate-aiding supporter and supporting the second group of side walls of the substrate that are different from the first group of side walls being supported by the substrate supporter.

6. The evaporation apparatus of claim 3, in which multiple fixing plates are physically coupled to the coupling bar.

7. The evaporation apparatus of claim 6, in which the substrate-aiding supporter comprises:
- a first substrate-aiding supporter for supporting the second group of side walls of the substrate that are different from the first group of side walls being supported by the substrate supporter; and
- a second substrate-aiding supporter disposed to face the first substrate-aiding supporter and support the second group of side walls of the substrate that are different from the first group of side walls being supported by the substrate supporter.

8. The evaporation apparatus of claim 3, in which the substrate-aiding supporter comprises:
- a first substrate-aiding supporter for supporting the second group of side walls of the substrate that are different from the first group of side walls being supported by the substrate supporter; and
- a second substrate-aiding supporter disposed to face the first substrate-aiding supporter and supporting the second group of side walls of the substrate that are different from the first group of side walls being supported by the substrate supporter.

9. The evaporation apparatus of claim 2, in which the substrate-aiding supporter comprises:
- a first substrate-aiding supporter for supporting the second group of side walls of the substrate that are different from the first group of side walls being supported by the substrate supporter; and
- a second substrate-aiding supporter disposed to face the first substrate-aiding supporter and supporting the second group of side walls of the substrate that are different from the first group of side walls being supported by the substrate supporter.

10. The evaporation apparatus of claim 1, in which the substrate-aiding supporter comprises:
- a first substrate-aiding supporter for supporting the second group of side walls of the substrate that are different from the first group of side walls being supported by the substrate supporter; and
- a second substrate-aiding supporter disposed to face the first substrate-aiding supporter and supporting the second group of side walls of the substrate that are different from the first group of side walls being supported by the substrate supporter.

11. An evaporation apparatus, comprising:
a substrate supporting unit comprising:
- a substrate supporter supporting two side walls of a substrate received by a chamber, with the two side walls of the substrate being opposite to and facing each other, and the side walls of the substrate being located along an intake direction of the substrate during reception of the substrate by the chamber; and
- at least one substrate-aiding supporter, each of the at least one substrate-aiding supporter supporting one of side walls of the substrate with the side walls of the substrate being different from the side walls being supported by the substrate supporter.

12. The evaporation apparatus of claim 11, comprised of a supporting plate of the at least one substrate-aiding supporter being in physical contact with a surface of the substrate with the surface being different from a surface having a mask pattern, and the substrate supporter being in physical contact with the surface of the substrate with the surface that is different from the surface having the mask pattern.

13. A method of supporting a substrate in an evaporation apparatus, the method comprising:
- providing a substrate supporter and at least one substrate-aiding supporter in an interior of a chamber of the evaporation apparatus;
- receiving, within the chamber, the substrate through an opening into the chamber;
- moving the substrate supporter in the chamber by a lever assembly, and supporting two opposite side walls of the substrate by the substrate supporter, with the substrate supporter physically contacting a surface of the substrate, and with the surface being opposite to and different from a surface having a mask pattern; and
- moving the at least one substrate-aiding supporter in the chamber by a driver, and supporting side walls of the substrate by the at least one substrate-aiding supporter with the side walls of the substrate being different from the side walls being supported by the substrate supporter, with the at least one substrate-aiding supporter being in physical contact with the surface of the substrate, and with the surface being opposite to and different from the surface having the mask pattern.

14. An evaporation apparatus for practice of the method of claim 13, comprised of:
- a supporting plate of the at least one substrate-aiding supporter in physical contact with a surface of the substrate that is different from a surface having a mask pattern; and
- the substrate supporter is in physical contact with the surface of the substrate that is different from the surface having the mask pattern.

15. An evaporation apparatus for the practice of the method of claim 13, in which the substrate-aiding supporter comprises:
- a supporting bar disposed to support the side walls of the substrate;

a driver moving the supporting bar in opposite directions; and the supporting bar comprising:
- a fixing plate having a supporting plate in physical contact with a bottom surface of the substrate; and
- a coupling bar physically coupling the driver to the fixing plate; and the coupling bar comprising a pair of structures extending from the side walls of the substrate that are different from the side walls supported by the substrate supporter, with the pair of structures being physically coupled to the driver.

* * * * *